United States Patent
Ohashi

Patent Number: 6,160,244
Date of Patent: Dec. 12, 2000

[54] SUSCEPTORS

[75] Inventor: Tsuneaki Ohashi, Ogaki, Japan

[73] Assignee: NGK Insulators, Ltd., Nagoya, Japan

[21] Appl. No.: 09/314,367

[22] Filed: May 19, 1999

[30] Foreign Application Priority Data

May 29, 1998 [JP] Japan .................................. 10-149573

[51] Int. Cl.[7] .............................. H05B 3/68; C23C 16/00
[52] U.S. Cl. ...................................... 219/444.1; 118/725
[58] Field of Search ........................... 219/444.1, 468.1,
219/468.2, 544; 338/252, 253; 118/725,
728, 729, 621, 500

[56] References Cited

U.S. PATENT DOCUMENTS

| | | | |
|---|---|---|---|
| 3,110,795 | 11/1963 | Bremer | 219/468.1 |
| 3,275,801 | 9/1966 | Churchill | 219/468.2 |
| 5,280,156 | 1/1994 | Niori et al. | 118/725 |
| 5,566,043 | 10/1996 | Kawada et al. | 219/466.1 |
| 5,591,269 | 1/1997 | Arami et al. | 118/725 |
| 5,851,298 | 12/1998 | Ishii | 219/444.1 |

*Primary Examiner*—Sang Paik
*Attorney, Agent, or Firm*—Burr & Brown

[57] ABSTRACT

A susceptor comprising a planar heat-conductive layer having a heating surface for heating an object to be heated and a rear surface, a supporting member for supporting the planar heat-conductive layer from a side of the rear surface thereof, first and second heat-choking portions provided between the rear surface of the planar heat-conductive layer and the supporting member in this order, said first heat-choking portion being adapted for restricting a heat flow from the rear surface of the planar heat-conductive layer toward the supporting member, and the second heat-choking portion provided between the first heat-choking portion and the supporting member and adapted for restricting a heat flow from the first heat-choking portion to the supporting member.

24 Claims, 7 Drawing Sheets

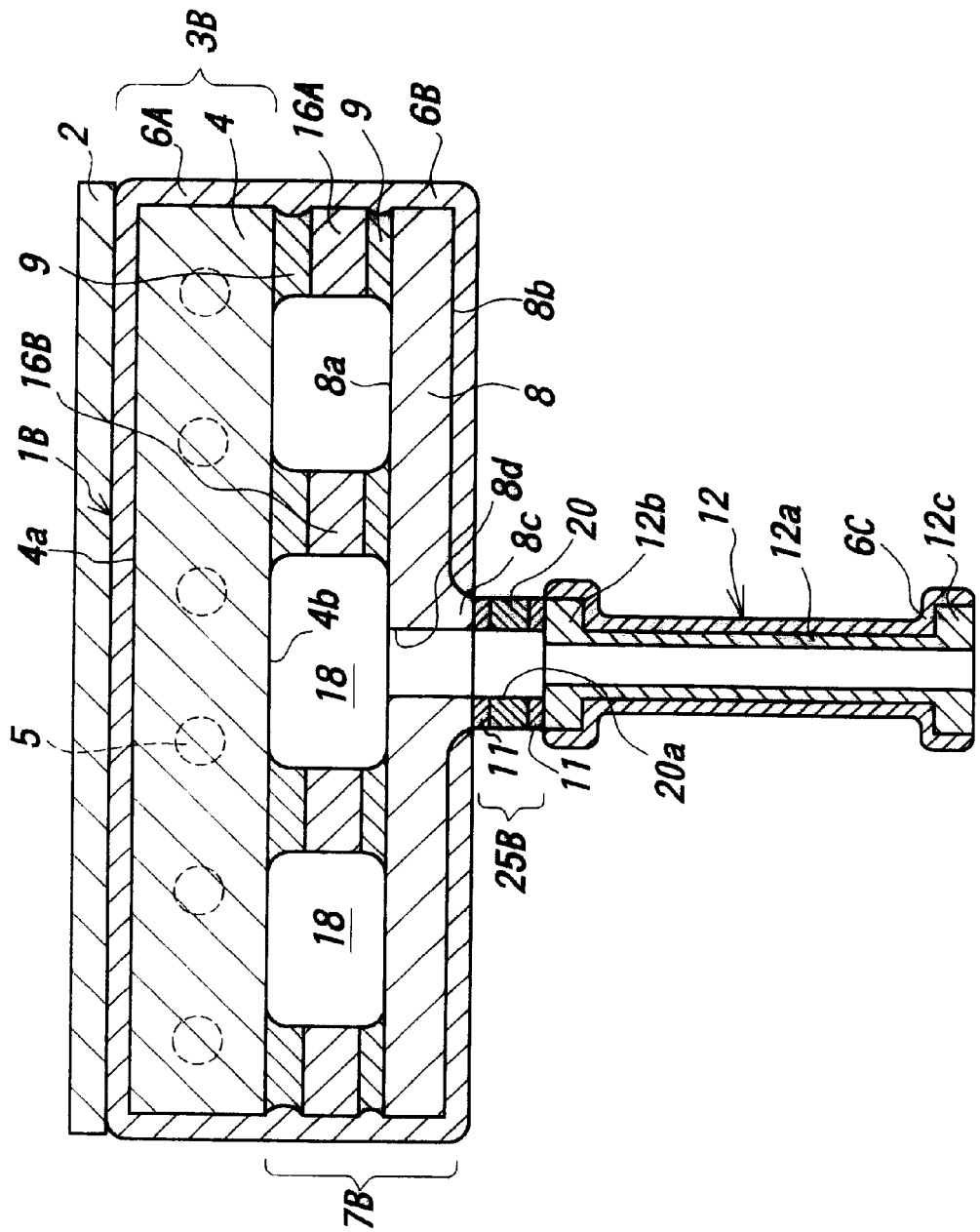

SUSCEPTORS

BACKGROUND OF THE INVENTION

(1) Field of the Invention

The present invention relates to susceptors for supporting and heating semiconductor wafers, liquid panels, silicon single crystal wafers for solar cells, etc.

(2) Related Art Statement

As the susceptors for supporting and heating the semiconductor elements, the liquid panels, the silicon single crystal wafers or the like, it is proposed that a heat-generating element is buried in a susceptor, and an electrode cable etc. are housed in slender supporting rod or rods, a supporting tube or a protective tube.

It has been increasingly demanded that the diameter of the wafers to produce the semiconductor wafers is increased or the size of the liquid panels is made lager. For this purpose, it has been demanded to make the size of the susceptors lager. Thus, it has been demanded to make the diameter of the planar heat-conductive layers of the susceptors not less than 300 mm. However, as the diameter of the heat-conductive layer increases, it becomes very difficult to keep the temperature of the heating surface of the planar heat-conductive layer uniform, which poses a problem difficult to be solved. For, if the temperature distribution of the heating surface of the planar heat-conductive layer becomes non-uniform, the susceptor will be unacceptable. Particularly if a plurality of, for example three, supporting rods or protective tubes are attached to the planar heat-conductive layer to realize a large-size susceptor, the temperature of the heating surface becomes particularly more non-uniform.

SUMMARY OF THE INVENTION

It is an object of the present invention to lessen deviations in the temperature distribution at the heating surface of a planar heat-conductive layer of the susceptor which includes that planar heat-conductive layer, a supporting tube, etc.

The susceptor according to the present invention comprises a planar heat-conductive layer having a heating surface for heating an object to be heated and a rear surface, a supporting member for supporting the planar heat-conductive layer from a side of the rear surface thereof, first and second heat-choking portions provided between the rear surface of the planar heat-conductive layer and the supporting member in this order, said first heat-choking portion being adapted for restricting a heat flow from the rear surface of the planar heat-conductive layer toward the supporting member, and the second heat-choking portion provided between the first heat-choking portion and the supporting member and adapted for restricting a heat flow from the first heat-choking portion to the supporting member.

The present inventors examined reasons why the deviations in the temperature at the heating surface of the susceptor became larger when the size of the susceptor was increased or when the planar heat-conductive layer was provided with a plurality of the supporting tubes or the supporting rods. It is common that the design of the planar pattern of the heat-generating element in the planar heat-conductive layer is optimized to make the temperature of the heating surface of the susceptor uniform. However, an amount of heat coming out of the susceptor through the supporting rods, the supporting tubes or the like largely varies depending upon the surrounding temperature, the use condition and the intended temperature range. For this reason, even if the planar pattern of the heat-generating element is designed and produced to optimize the temperature distribution of the heating surface of the susceptor in a certain temperature region or under a certain condition, for example, the distribution of the temperature at the heating surface tends to be conspicuously deteriorated if the use condition or the use temperature changes.

The present inventors reached a technical idea that first and second heat-choking portions are provided between the rear surface of the planar heat-conductive layer and the supporting member in this order, a heat flow from the rear surface of the planar heat-conductive layer toward the supporting member is restricted by the first heat-choking portion, and a heat flow from the first heat-choking portion toward the supporting member is restricted by the second heat-choking portion. The provision of the two-stage heat-choking portions could make the temperature of the heating surface of the planar heat-conductive layer more uniform and realize a favorable temperature distribution in a specific area in a temperature range or under a use condition which is wider than that in the conventional technique. Particularly if the diameter of the planar heat-conductive layer is increased or if the planar heat-conductive layer is provided with a plurality of supporting members, the temperature distribution of the heating surface can be remarkably enhanced.

The present invention is particularly preferable to large-size susceptors, and more particularly to susceptors with planar heat-conductive layers having diameters of not less than 300 mm. Further, the number of the supporting member (s) such as the supporting rod(s) or the supporting tube(s) is not limited. If plural supporting members are used, the invention is particularly effective in a case where the number of the supporting members is two or three. However, the invention may be employed in a case where the number of the supporting members is 4 to 20 is not less than 4 to not more than 20.

These and other objects, features and advantages of the invention will be appreciated when in conjunction with the attached drawings, with the understanding that some modifications, variations and changes of the same could be easily made by the skilled person in the art.

BRIEF DESCRIPTION OF THE ATTACHED DRAWINGS

For a better understanding of the invention, reference is made to the attached drawings, wherein:

FIG. 5 is a vertically sectional view schematically showing a susceptor 1B according to another embodiment of the present invention;

DETAILED DESCRIPTION OF THE INVENTION

Figure 1:
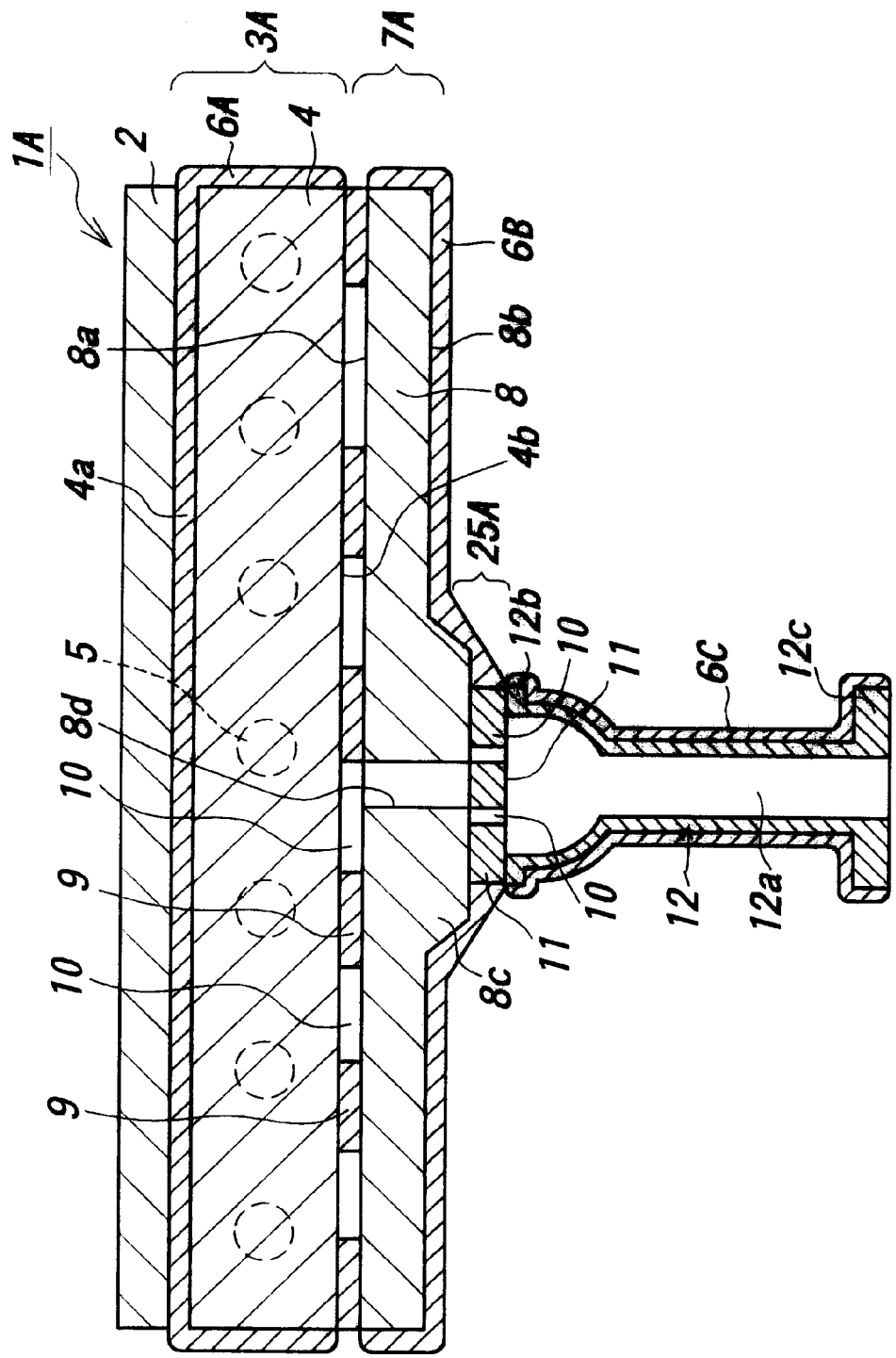
FIG. 1 is a vertically sectional view schematically showing a susceptor 1 according to one embodiment of the present invention.

The present invention will be explained below in more detail.

The planar heat-conductive layer may be heated with an external heat source such as an infrared lamp. However, a preferred embodiment is that the planar heat-conductive layer comprises a substrate and a heat-generating element arranged in the substrate. In this case, the use life of the heating element is prolonged, because the first and second heat-choking portions function as a seal to protect the heating element in the planar heat-conductive layer from the surrounding atmosphere of the susceptor.

In a further preferred embodiment, the substrate comprises a groove opened to the rear surface of the planar heat-conductive layer, and the heat-generating element is arranged in this groove.

The following materials are preferred for each of the substrate of the planar heat-conductive layer, the supporting member, and a back plate mentioned later.

(1) Ceramics such as aluminum nitride, alumina or mullite (2) Alloys such as an aluminum alloy, stainless steel, Kovar, iron-nickel based low expansion alloy (e.g. Fe—42Ni), super alloy, Fe—Cr—Al based heat-resistant alloy and Ni—Cr based heat-resistant alloy (3) Composite materials composed of a ceramic material selected from (1) and an alloy from (2)

Among them, the ceramic-metal composite material includes both a ceramic-based composite material and a metal-based composite material. For example, a composite material obtained by impregnating a ceramic preform with a molten metal or one obtained by a powder metallurgical method (powder molding+firing) may be recited. The permeation of the metal into the ceramic preform may be performed either under pressure or with use of a permeating aid under no pressure or ordinary pressure. If the powder metallurgical method is adopted, a sintering aid may be incorporated into a molded body of the powder.

A particularly preferred composite material will be explained. Although the ceramic material to constitute a preform is not particularly limited so long as aluminum or an aluminum alloy can be impregnated into it, an aluminum-based ceramic material is preferred, and alumina and aluminum nitride are particularly preferable.

In order to produce a preform, for example, after given ceramic particles are dispersed in a solvent such as isopropanol and an organic binder such as a liquid acrylic copolymer binder is mixed with the dispersion, a slurry is prepared by mixing the mixture in a large-size pot for 2 to 40 hours under stirring. Thereafter, the slurry is granulated in particle diameters of 30 to 100 $\mu$m by using an explosion-proof type spray dryer. Then, the granulated powder is charged into a given mold, and a preform is produced by press molding the powder under a pressure of 200 to 7000 kgf/cm$^2$ by using a hydraulic press.

Instead of producing the slurry with the organic binder, a preform can be produced by obtaining a powder through spray-mixing ethanol or the like into ceramic particles and press molding the powder in the same manner as mentioned above.

Aluminum or the aluminum alloy may be impregnated into the preform by using a self-impregnating method, a pressure impregnating method or a vacuum impregnating method.

The first heat-choking portion preferably includes a back plate, and a thermal conductivity of the back plate is not more than ½, preferably not more than ⅛, of that of the planar heat-conductive layer. The back plate restricts the heat flow from the rear surface of the planar heat-conductive layer.

A method of integrating the planar heat-conductive layer and the supporting member and further the back plate if necessary is not particularly limited, but brazing and soldering are preferred. Further, the constituent members may be tightened together by using bolts in the state that metal sealants are interposed among the planar heat-conductive layer, the back plate and the supporting member.

In a case where the constituent members of the susceptor are joined together by brazing or soldering and joining them via resulting metallic joining layers, the heat flows through the first and second heat-choking portions can be restricted by reducing the area of each of the joining layers.

In this case, it is particularly preferable that the first heat-choking portion includes a back plate, and a first joining layer joining the back plate to the planar heat-conductive layer, and an area of the rear surface of the planar heat-conductive layer is 3 to 300 assuming that that of the first joining layer is 1.

Furthermore, it is preferable that the second heat-choking portion includes a second joining layer joining the back plate to the supporting member directly or via a heat-insulating member, and an area of the back plate on a side of the supporting member is 20 to 10000 assuming that that of the second joining layer is 1.

The heat-insulating member is either one of the following.

(1) The heat conductivity of the heat-insulating member is not more than ½ of that of the back plate.

(2) A hollow portion or t h rough-hole is formed in a central portion of the heat-insulating member or a groove is formed in a surface portion of the heat-insulating member, so that a heat flow conducting through the heat-insulating member is reduced.

In a still preferred embodiment of the present invention, the planar heat-conductive layer comprises an electrically conductive material, at least the heating surface of the planar heat-conductive layer is covered with a dielectric layer, and the object to be heated is adsorbed onto the planar heat-conductive layer by applying a DC voltage between the planar heat-conductive layer and the object. By so constructing, the present invention can offer a large-size electrostatic chuck with a heating surface having a particularly larger area (for example, 700 cm$^2$ or more).

In a still further preferred embodiment, the planar heat-conductive layer, the first heat-choking portion, the second heat-choking portion and the supporting member are electrically conductive, and the supporting member is grounded. By so constructing, no earth wire needs to be separately provided.

When the constituent members of the susceptor are to be brazed together, the brazing material is not particularly limited. However, an aluminum alloy brazing material, a gold alloy brazing material and a copper alloy brazing material are preferred from the standpoint of corrosion resistance against a halogen-based corrosive gas. Among them, the aluminum alloy brazing material is preferred if an aluminum/metal composite material is used for the constituent member(s).

The aluminum alloy brazing material is preferably made of an aluminum alloy which incorporates one or more kinds of active metals selected from the group consisting of magnesium, titanium, zirconium and hafnium and contains not less than 70 mol % of aluminum.

Preferably, this aluminum alloy contains not less than 1 mol % and not more than 10 mol % of one or more kinds of active metals (particularly preferably magnesium) selected from the group consisting of magnesium, titanium, zirconium and hafnium.

If the rate of the active metal(s) is set at not less than 1 mol %, affinity between the metallic component or the reinforcing agent in the substrate is enhanced. If the rate of the active metal(s) is set at not more than 10 mol %, the local formation of an intermetallic compound, etc. which may cause brittleness can be suppressed.

The content of aluminum in the alloy brazing material is a remainder obtained by subtracting the total content of the active metal(s) and the below-mentioned third ingredient from 100 mol % which is the total content of the metals.

The above third ingredient may be incorporated into the alloy brazing material. As the third ingredient, silicon or boron may be preferably used, because such does not influence aluminum. The third ingredient functions to lower the melting point of the brazing material. The fluidability of the brazing material is improved even at the same temperature through the incorporation of the third ingredient. The content of the third ingredient is preferably 1.5 to 10 mol %.

The alloy constituting the brazing material preferably contains 1 to 6 mol % of magnesium and 1.5 to 10 mol % of silicon.

A film of one or more kinds of metals selected from the group consisting of magnesium, titanium, zirconium and hafnium may be formed on a joining surface of each constituent member by sputtering, vapor deposition, plating or the like prior to the brazing. Further, a foil of one or more kinds of metals selected from the group consisting of magnesium, titanium, zirconium and hafnium may be interposed between surfaces of adjacent constituent members to be joined.

Before heating to effect the brazing, it is preferable that at least one of an oxidized film and a nitrided film on each joining surface of each of the constituent members is removed by washing each joining surface with an acid solution or an alkaline solution.

As the heating element, the following are preferred.

(1) A heating element including a linear or ribbon-shaped heating body made of mobdenum silicide, a nickel-chromium alloy or a nickel-chromium-aluminum alloy and a ceramic bond or cement (including Portland cement or alumina cement) applied and solidified onto the surface of the heating body. A sol or gel coating made of a powdery ceramic material or metal alkoxide may be applied to the heating body.

(2) A heating element (so-called sheath heater) including a stainless steel pipe or the like filled with particles of an insulating ceramic material such as magnesium oxide or aluminum nitride and the heating body mentioned in (1) buried in a central hollow portion of the pipe or the like.

The planar pattern of the heating element may be of a one-zone type or a two-zone type, and one-zone type is particularly preferable.

Materials for the film covering the planar heat-conductive layer, the back plate and the supporting member are preferably aluminum nitride, alumina, mullite, boron carbide, aluminum fluoride, a fluoride of a rare earth and/or alkaline earth metal element, a yttoria-alumina based ceramic material such as a yttoria-stabilized zirconia and a composite material in which any of the above materials are combined. Such a film is preferably formed by powder applying and baking, flame spraying or sol/gel process. If an aluminum alloy-based material such as aluminum nitride/aluminum or aluminum/silicon carbide is used as the material of the constituent members of the susceptor, an alumina film may be formed on the surface of each constituent member by oxidizing it.

It is preferable that a difference in a coefficient of thermal expansion between the constituent members of the susceptor and the film therefor is not more than $1\times10^{-6}/°$ C. from the standpoint of the heat-resistant cycling of the susceptor.

Figure 2A:
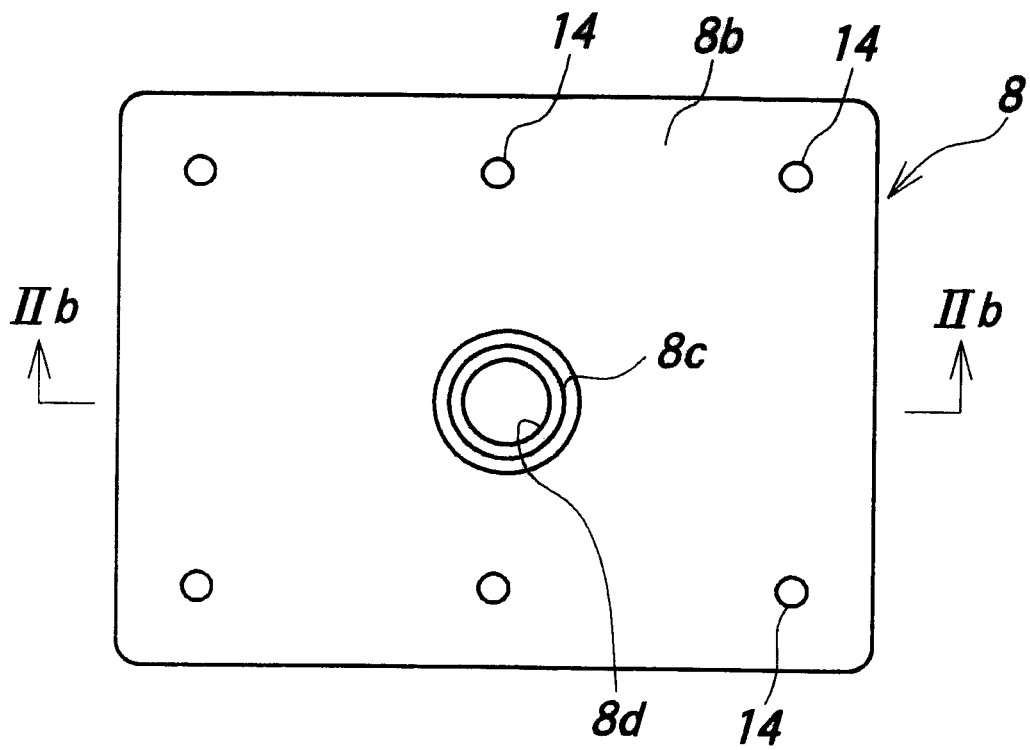
FIG. 2(*a*) is a plane view of a back plate 8, FIG. 2(*b*) being a vertical sectional view of the back plate 8.
Figure 2B:
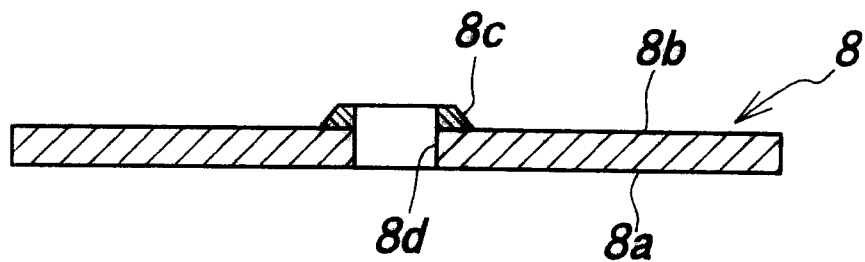
Figure 3:
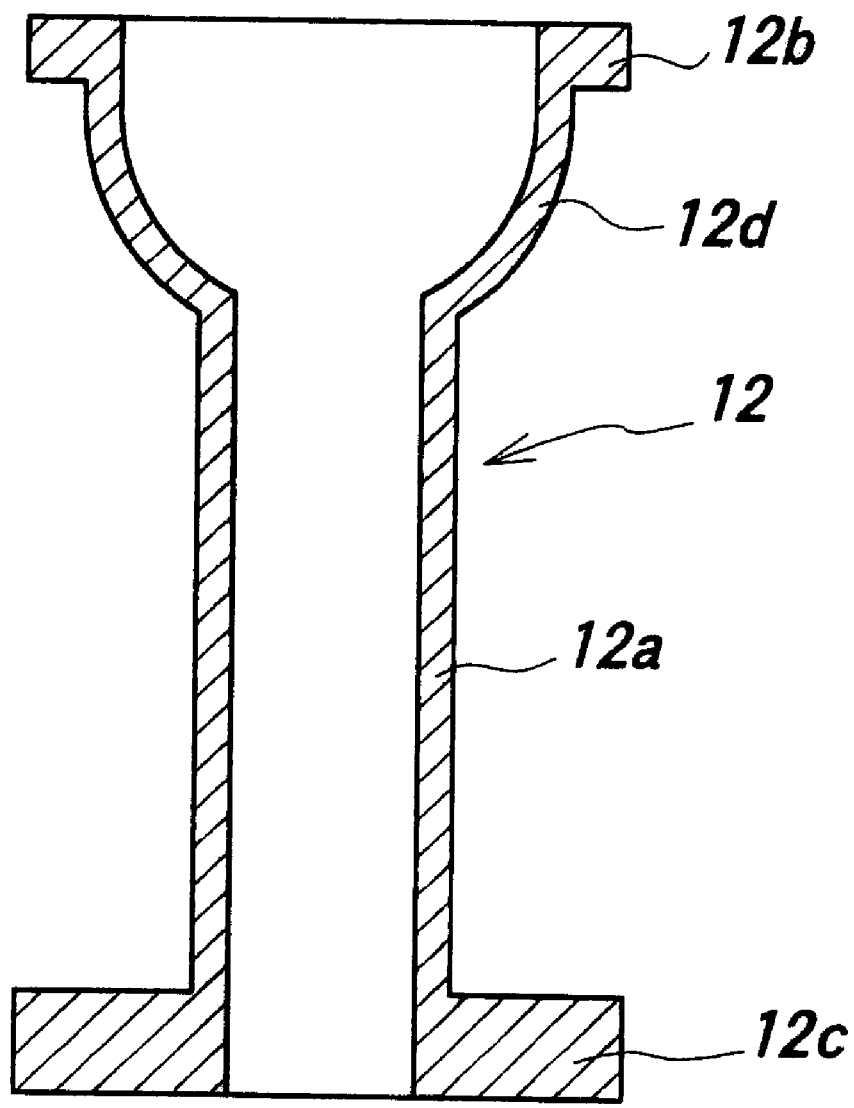
FIG. 3 is a vertical sectional view of a supporting tube 12.
Figure 4A:
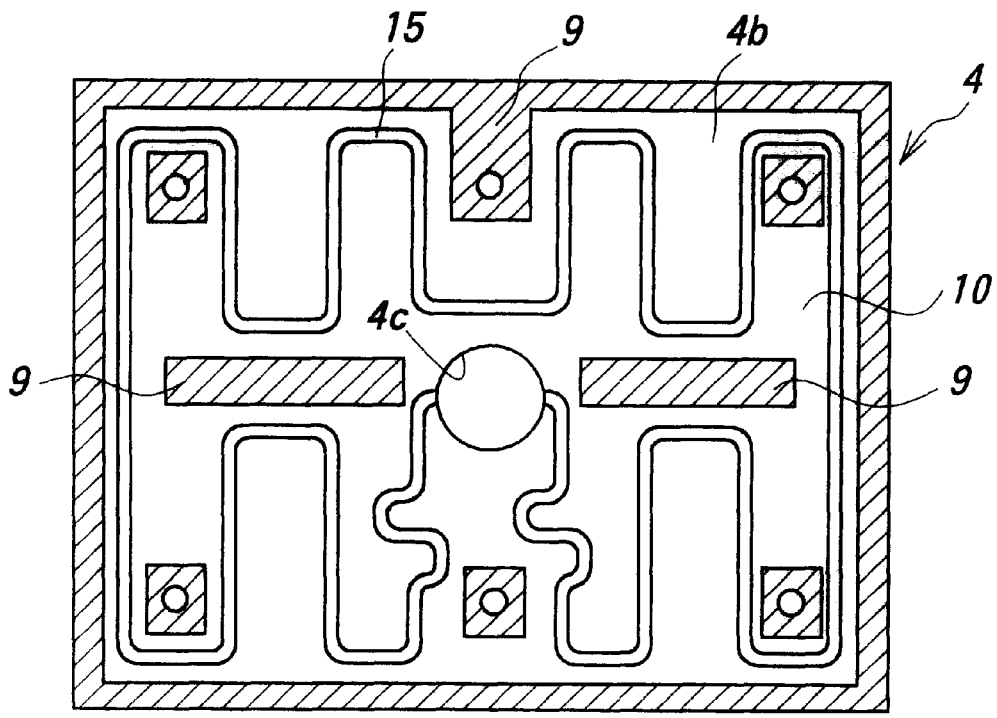
FIG. 4(*a*) is a plane view showing a substrate 4 as viewed from a side of a rear surface 4*b* thereof in which shadow portions denote joining layer-presenting areas, FIG. 4(*b*) being a sectional view showing a principal portion of a vicinity of a groove.
Figure 4B:
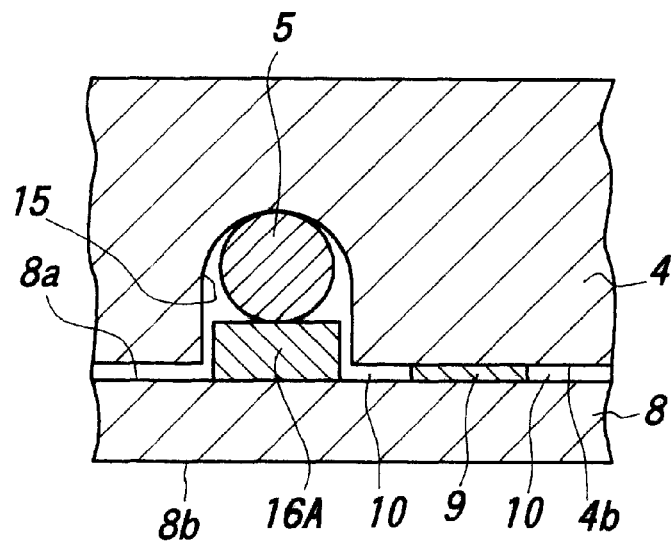

FIG. 1 is a vertically sectional view schematically showing a susceptor according to one embodiment of the present invention, FIG. 2(a) is a plane view of a back plate 8, and FIG. 2(b) is a vertical sectional view of the back plate 8. FIG. 3 a vertically sectional view of a supporting pipe 12, FIG. 4(a) is a plane view showing a pattern of a joining layer on a side of a rear surface 4b of a substrate 4, and FIG. 4(b) is a sectional view showing a principal portion of a vicinity of a groove in the substrate 4 in an enlarged scale.

The susceptor 1A includes a planar heat-conductive layer 3A, a first heat-choking portion 7A, a second heat-choking portion 25A and a supporting member 12. In the planar heat-conductive layer 3A, a heating surface 4a and a peripheral surface of a flat board-shaped substrate 4 are covered with a film 6A. An object 2 to be heated is placed on the heating surface 4a. In the substrate 4 is formed a groove 15 having a planar pattern as shown in FIG. 4(a), and the groove 15 is opened to a rear surface 4b of the substrate 4. The heat-generating element 5 is housed in the groove 15. A reference numeral 4c denotes a through-hole through which an electric power feed cable, a thermocouple, etc. are to be passed.

The back plate 8 is joined to the rear surface 4b of the planar heat-conductive layer 3A via a first joining layer 9. The joining layer 9 is not interposed all over the interface between the back plate 8 and the rear surface 4b, but provided according to the planar patter as shown in FIG. 4(a). A reference numeral 10 denotes an opening between the substrate 4 and the back plate 8. In this embodiment, the area of the back surface 4b is 3 to 300, assuming that that of the first joining layer 9 is 1. As shown in FIG. 4(b), a spacer 16A is arranged under the heat-generating element 5 inside the groove 15, and contacts a surface 8a of the back plate 8. By so constructing, the heating element 5 will not directly contact the back plate 8 during use of the susceptor, so that reduction in uniformity of the temperature at the heating surface due to such a contact can be avoided. In FIG. 1, illustration of details of the constituent members as shown in FIGS. 2 to 4 is omitted.

As shown in FIGS. 2(a) and 2(b), a projection 8c is provided at a side of the rear surface 8b of the back plate in a central portion thereof, and a through-hole 8d is provided from the front surface 8a to the rear surface 8b at the location of the projection 8c. The rear surface 8b and the peripheral surface of the back plate 8 are covered with a film 6B.

As shown in FIG. 3, a supporting tube 12 includes a main body 12a, a flange portion 12b at one end of the main body 12a, and a flange portion 12c at the other end thereof, and the main body 12a includes a diameter-enlarging portion 12d of which the diameter gradually increases as the location goes from the main body 12a to the flange portion 12b.

The outer surface of the supporting tube is covered with a film 6C. The flange portion 12b of the supporting tube 12 is joined to the projection 8*c* of the back plate 8 via a second joining layer 11. The second joining layer is not joined to the entire end surface of the flange portion 12*b*, while openings 10 exist in areas with no second joining layer. A hollow portion of the supporting tube 12 is communicated with the through-hole 8*d* of the back plate 8, and an electric power feed cable for the heat-generating element and other electric wire such as a thermocouple if necessary not shown are inserted through them.

Figure 6A:
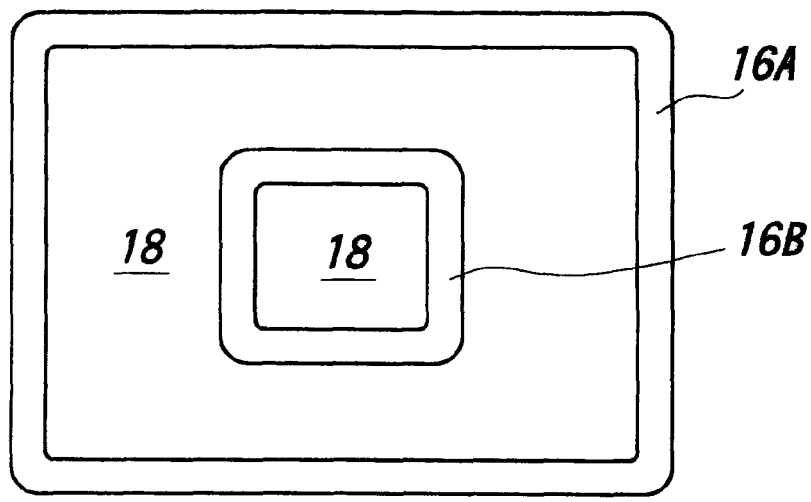
FIGS. 6(*a*) is a plane views showing frame-shaped insulating materials 16A and 16B, FIG. 6(*b*) being a plane view showing a ring-shaped insulating material 20.
Figure 6B:
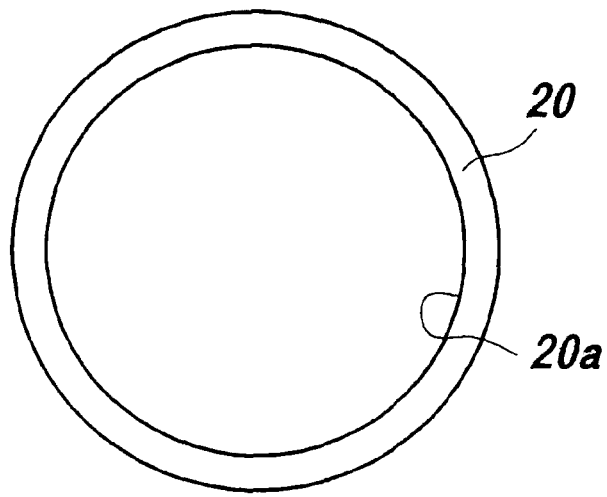
Figure 7:
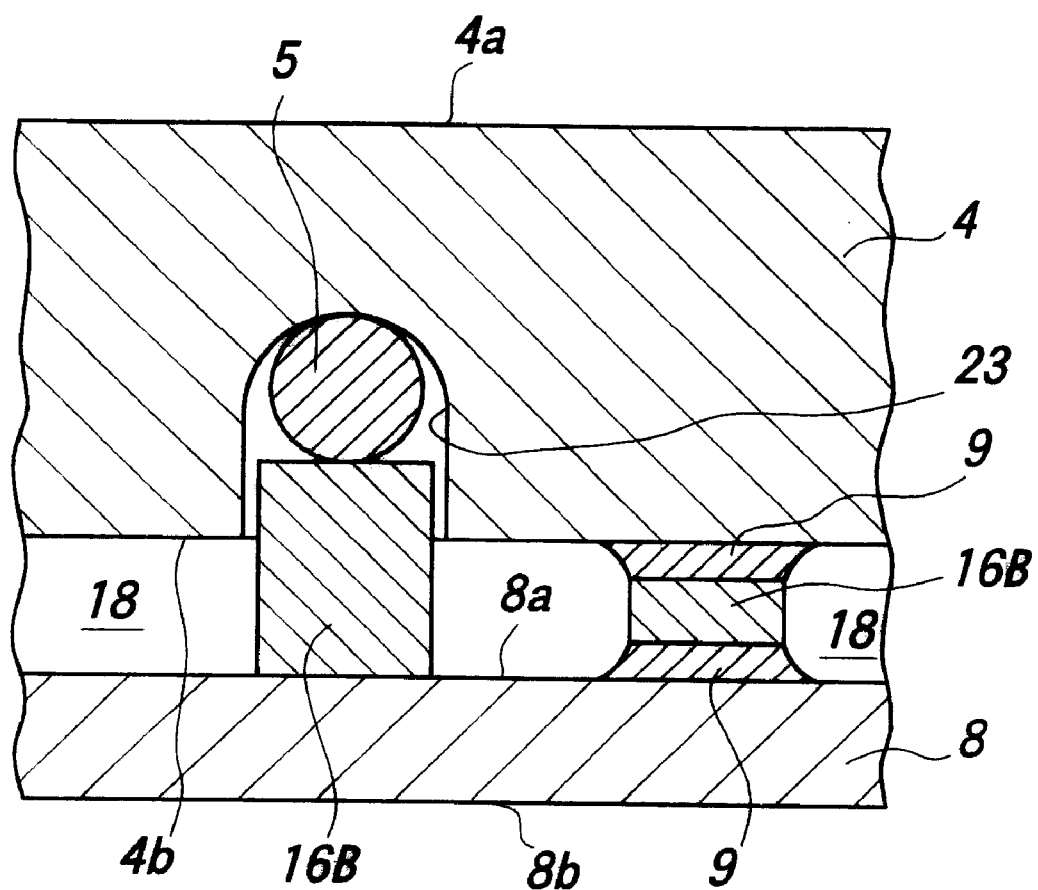
FIG. 7 is a sectional view showing a principal portion of a vicinity of a groove 23 in an enlarged scale.

FIG. 5 is a vertically sectional view schematically showing a susceptor 1B according to another embodiment of the present invention, and FIGS. 6(*a*) is a plane views showing frame-shaped insulating materials 16A and 16B, FIG. 6(*b*) being a plane view showing a ring-shaped insulating material 20. FIG. 7 is a sectional view showing a principal portion of a vicinity of a groove 23 in an enlarged scale. The susceptor 1B includes a planar heat-conductive layer 3B, a first heat-choking portion 7B, a second heat-choking portion 25B and a supporting tube 12. In the planar heat-conductive layer 3B, a heating surface 4*a* and a peripheral surface of a flat board-shaped substrate 4 are covered with a film 6A. An object 2 to be heated is placed on the heating surface 4*a*. In the substrate 4 is formed a groove 23 having a planar pattern as shown in FIG. 4(*a*), for example, and the groove 23 is opened to a rear surface 4*b* of the substrate 4. In FIG. 5, such a groove is not shown. The heat-generating element 5 is housed in the groove 23. A spacer 16B is arranged under the heat-generating element 5, and contacts a surface 8*a* of the back plate 8.

The back plate 8 is joined to the rear surface 4*b* of the planar heat-conductive layer 3B via heat-insulating materials 16A and 16B. As shown in FIG. 6(*a*), each of the insulating material 16A and 16B is of an almost rectangular shape, and the insulating material 16A surrounds the one 16B. The insulating materials 16A and 16B are joined to the surface 8*a* of the back plate 8 and the back surface 4*b* of the planar heat-conductive layer via the joining layers 9, respectively, while openings 18 are formed in areas with no heat-insulating material 16A or 16B. As a result, the area of the back surface 4*b* of the planar heat-conductive layer 4 is 3 to 300 as mentioned before, assuming that the area of the first joining layer 9 is 1.

As shown in FIG. 5, the supporting tube 12 includes a main body 12*a*, and a flange 12*b* and a flange 12*c* provided at opposite ends of the main body, respectively. As mentioned before, a diameter-enlarging portion 12*d* may be provided. The outer surface of the supporting tube is covered with a film 6C.

A ring-shaped heat-insulating material 20 as shown in FIG. 6(*b*) is interposed between the flange portion 12*b* of the supporting member 12 and a projection 8*c* of the back plate, and the heat-insulating material 20 is joined to the projection 8*c* of the back plate 8 and the flange portion 12*b* of the supporting tube by second joining layers 11, respectively. Communication is made among a hollow portion of the supporting tube 12, a through-hole 20*a* of the heat-insulating material 20 and a through-hole 8*d* of the back plate 8, through which an electric power feed cable for the heat-generating element and another electric wire such as a thermocouple if necessary are inserted.

In the susceptor of FIGS. 5 to 7, since the heating surface is electrically insulated from the supporting tube 12 by the heat-insulating portions 7B and 25B, the susceptor can be operated as an electrostatic chuck by connecting a metallic cable or a metallic rod to the heating surface.

Meanwhile, the susceptor in FIGS. 1 to 4 can be operated as an electrostatic chuck by inserting an insulator at a portion to which the supporting tube is fitted to effect electric insulation. Likewise, a function as a high frequency wave-generating electrode may be afford to the susceptor.

EXAMPLES

In the following, particularly preferred examples will be explained.

Example 1

A susceptor 1 as shown in FIGS. 1 to 4 was produced. More specifically, particles of aluminum nitride having the average particle diameter of 16 $\mu$m were dispersed in isopropanol as a solvent, and a liquid acrylic copolymer binder was added to the dispersion. A slurry was obtained by mixing the mixture in a large-size pot mill under stirring for 4 hours. The slurry was granulated by means of the explosion type spray drier, thereby obtaining a spherically granulated powder having the average particle diameter of 150 $\mu$m. The granulated powder was charged into a given mold, which was uniaxially press molded under a pressure of 200 kgf/cm$^2$ by using a hydraulic press, thereby producing a large-size preform, 380 mm in diameter and 300 mm thickness.

After the preform was sufficiently dried and dewaxed, aluminum was impregnated into the preform by a non-pressurized metal impregnation process in which the preform was contacted with a melt of an aluminum alloy (92.6 mol % aluminum, 5.5 mol % magnesium, 1.9 mol % silicon) at 900° C. in an atmosphere of nitrogen—1% hydrogen under a pressure of 1.5 atms for 24 hours. Then, the preform was pulled up from the melt, thereby obtaining an aluminum-based composite material. The weight rate of the aluminum nitride was 70%, and the composite material had a coefficient of thermal expansion of $8.7 \times 10^{-6}$/° C., a heat conductivity of 170 W/mK and a specific resistance of $5 \times 10^{-5}$·cm.

A substrate 4 of a planar heat-conductive layer, a back plate 8 and a supporting tube 12 were prepared from this composite material. The substrate 4 had an outer configuration of 400 mm×500 mm×25 mm with a groove 15 having a width of 13 mm and a maximum depth of 15 mm. The back plate had an outer configuration of 400 mm×500 mm×7.9 mm with a projection 8*c* having a height of 4.2 mm as measured from a back surface 8*b* and a thickness of 12 mm, a diameter of 50 mm. The thickness of a main body of the supporting tube was 2.5 mm to 3.5 mm, and its outer diameter was 35 mm. A flange portion 12*b* had an outer diameter of 50 mm and a thickness of 8 mm.

The above constituent parts were held at 1050° C. in air for 5 hours, thereby forming a film of alumina on each surface of each constituent parts. Then, fresh surfaces of the composite material were exposed by grinding or polishing the rear surface 4*b* of the substrate 4, the surface 8*a* of the back plate 8, the surface of the projection 8*c* and the surface of the flange portion of the supporting tube.

Powdery magnesium oxide was charged into a sheath heater covered with a stainless steel pipe, and a nickel-chromium alloy wire was inserted thereinto. The resulting assembly was used as a heat-generating element. The heat-generating element was sunk in the groove of the substrate, and twelve aluminum alloy blocks were placed under the heat-generating element as spacers. A set of nickel power feed was passed through a hollow shaft, and a sheet of Al—10Si—2Mg having a thickness of 0.1 mm was interposed between portions to be joined. The portions to be joined had been plated with nickel. A weight of 6 kg was placed on the resulting assembly, and the constituent parts were joined by brazing in vacuum.

Example 2

A susceptor as shown in FIGS. 5 to 7 was produced. More specifically, a substrate 4, a back plate 8 and a supporting tube 12 were prepared in the same manner as in Example 1. Frame-shaped heat-insulating materials 16A and 16B were made of alumina having a purity of not less than 95%. Each of the heat-insulating materials had a thickness of 5 mm and a width of 10 mm. The outer heat-insulating material had an outer configuration of 400 mm×500 mm, and the inner heat-insulating material 16B had an outer configuration of 200 mm×200 mm. A ring-shaped heat-insulating material 20 was made of alumina having a purity of not less than 98% with an outer diameter of 50 mm, an inner diameter of 40 mm and a thickness of 5 mm. Nickel films are formed on each of the heat-insulating materials by sputtering.

A heat-generating element as in Example 1 was prepared, and sunk in a groove of the substrate. Twelve alumina blocks were arranged under the heat-generating element as spacers, and a set of power feed was passed through a hollow shaft. As each of first and second joining layers 9 and 11, an Al—10Si—2Mg alloy brazing material having a thickness of 0.1 mm was used. A weight of 6 kg was placed on the resulting assembly, and constituent parts were joined by brazing under vacuum. Then, a film of alumina was formed in a thickness of about 100 μm on a heating surface of the planar heat-conductive layer.

As is clear from the above, deviations in temperature at the heating surface of the planar heat-conductive layer can be reduced in the susceptor including this planar heat-conductive layer, the supporting tube therefor, etc.

What is claimed is:

1. A susceptor comprising:
   a planar, thermally-conductive substrate having a heating surface for heating an object, a rear surface, and a heat-generating element arranged in said substrate;
   a supporting member for supporting said substrate from the rear surface thereof;
   a first heat-choking portion arranged between said substrate and said supporting member, said first heat-choking portion comprising a back plate, the material of which is selected such that the thermal conductivity thereof is not more than ½ that of said substrate, such that heat flow from the rear surface of said substrate towards said supporting member is restricted; and
   a second heat-choking portion arranged between said first heat-choking portion and said supporting member and adapted to restrict heat flow from said first heat-choking portion toward said supporting member.

2. The susceptor of claim 1, wherein the material of the second heat-choking portion has a thermal conductivity less than that of said first heat-choking portion.

3. The susceptor of claim 1, wherein said substrate comprises a composite material of aluminum nitride and aluminum.

4. The susceptor of claim 1, wherein said substrate further comprises a groove that is open to said rear surface, and said heat-generating element is arranged in said groove.

5. The susceptor of claim 1, further comprising a first joining layer bonding said back plate to said substrate, wherein an area of the rear surface of said substrate is 3 to 300 assuming that the area of said first joining layer is 1.

6. The susceptor of claim 1, wherein said second heat-choking portion comprises a second joining layer bonding said back plate to said supporting member directly or via a heat-insulating member, wherein an area of said back plate on a side thereof that opposes said supporting member is 20 to 10000 assuming that the area of second joining layer is 1.

7. The susceptor of claim 1, wherein said substrate comprises an electrically conductive material, and the heating surface of said substrate is covered with a dielectric layer, wherein the object to be heated is adsorbed onto said substrate by applying a DC voltage between said substrate and the object to be heated.

8. The susceptor of claim 1, wherein all of said substrate, said first heat-choking portion, said second heat-choking portion and said supporting member are electrically conductive, and said supporting member is grounded.

9. A susceptor comprising:
   a planar, thermally-conductive substrate having a heating surface for heating an object, a rear surface, and a heat-generating element arranged in said substrate;
   a supporting member for supporting said substrate from the rear surface thereof;
   a first heat-choking portion arranged between said substrate and said supporting member, said first heat-choking portion comprising a back plate adapted to restrict heat flow from the rear surface of said substrate towards said supporting member;
   a first joining layer bonding said back plate to said substrate, wherein an area of the rear surface of said substrate is 3 to 300 assuming that the area of said first joining layer is 1; and
   a second heat-choking portion arranged between said first heat-choking portion and said supporting member and adapted to restrict heat flow from said first heat-choking portion toward said supporting member.

10. The susceptor of claim 9, wherein said substrate comprises a composite material of aluminum nitride and aluminum.

11. The susceptor of claim 9, wherein said substrate further comprises a groove that is open to said rear surface, and said heat-generating element is arranged in said groove.

12. The susceptor of claim 9, wherein said second heat-choking portion comprises a second joining layer bonding said back plate to said supporting member directly or via a heat-insulating member, wherein an area of said back plate on a side thereof that opposes said supporting member is 20 to 10000 assuming that the area of second joining layer is 1.

13. The susceptor of claim 9, wherein said substrate comprises an electrically conductive material, and the heating surface of said substrate is covered with a dielectric layer, wherein the object to be heated is adsorbed onto said substrate by applying a DC voltage between said substrate and the object to be heated.

14. The susceptor of claim 9, wherein all of said substrate, said first heat-choking portion, said second heat-choking portion and said supporting member are electrically conductive, and said supporting member is grounded.

15. A susceptor comprising:
   a planar, thermally-conductive substrate having a heating surface for heating an object and a rear surface;
   a supporting member for supporting said substrate from the rear surface thereof;
   a first heat-choking portion arranged between said substrate and said supporting member, said first heat-choking portion being adapted to restrict heat flow from the rear surface of said substrate towards said supporting member;
   a second heat-choking portion arranged between said first heat-choking portion and said supporting member and adapted to restrict heat flow from said first heat-choking portion toward said supporting member;

wherein all of said substrate, said first heat-choking portion, said second heat-choking portion and said supporting member are electrically conductive, and said supporting member is grounded.

16. The susceptor of claim 15, wherein said substrate comprises a composite material of aluminum nitride and aluminum.

17. The susceptor of claim 15, wherein said substrate further comprises a heat-generating element arranged therein.

18. The susceptor of claim 17, wherein said substrate further comprises a groove that is open to said rear surface, and said heat-generating element is arranged in said groove.

19. The susceptor of claim 15, wherein said first heat-choking portion comprises a back plate, the material of which is selected such that the thermal conductivity thereof is not more than ½ that of said substrate.

20. The susceptor of claim 19, further comprising a first joining layer bonding said back plate to said substrate, wherein an area of the rear surface of said substrate is 3 to 300 assuming that the area of said first joining layer is 1.

21. The susceptor of claim 15, wherein said first heat-choking portion comprises a back plate, and said susceptor further comprises a first joining layer bonding said back plate to said substrate, wherein an area of the rear surface of said substrate is 3 to 300 assuming that the area of said first joining layer is 1.

22. The susceptor of claim 21, wherein said second heat-choking portion comprises a second joining layer bonding said back plate to said supporting member directly or via a heat-insulating member, wherein an area of said back plate on a side thereof that opposes said supporting member is 20 to 10000 assuming that the area of second joining layer is 1.

23. The susceptor of claim 15, wherein said substrate comprises an electrically conductive material, and the heating surface of said substrate is covered with a dielectric layer, wherein the object to be heated is adsorbed onto said substrate by applying a DC voltage between said substrate and the object to be heated.

24. The susceptor of claim 1, wherein all of said substrate, said first heat-choking portion, said second heat-choking portion and said supporting member are electrically conductive, and said supporting member is grounded.

* * * * *